US011249146B2

(12) United States Patent
Heo

(10) Patent No.: US 11,249,146 B2
(45) Date of Patent: Feb. 15, 2022

(54) CIRCUIT FOR MONITORING VOLTAGE OF OUTPUT TERMINAL OF HALL SENSOR AND CIRCUIT FOR SUPPORTING LENS MODULE ACTUATING CONTROLLER

(71) Applicant: Samsung Electro-Mechanics Co., Ltd., Suwon-si (KR)

(72) Inventor: Chang Jae Heo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 182 days.

(21) Appl. No.: 16/829,159

(22) Filed: Mar. 25, 2020

(65) Prior Publication Data

US 2021/0173019 A1  Jun. 10, 2021

(30) Foreign Application Priority Data

Dec. 6, 2019  (KR) .................. 10-2019-0161309

(51) Int. Cl.
| | | |
|---|---|---|
| *G01R 33/00* | (2006.01) | |
| *G01R 15/20* | (2006.01) | |
| *G01R 33/07* | (2006.01) | |
| *G01P 1/00* | (2006.01) | |
| *H04N 5/225* | (2006.01) | |
| *G01D 5/14* | (2006.01) | |
| *G02B 7/02* | (2021.01) | |

(52) U.S. Cl.
CPC ......... *G01R 33/0082* (2013.01); *G01D 5/142* (2013.01); *G01P 1/006* (2013.01); *G01R 15/202* (2013.01); *G01R 33/072* (2013.01); *G02B 7/02* (2013.01); *H04N 5/2257* (2013.01)

(58) Field of Classification Search
CPC ...... G01R 33/0082; G01D 5/142; G01P 1/006
See application file for complete search history.

(56) References Cited

U.S. PATENT DOCUMENTS

| 6,400,131 B1* | 6/2002 | Turner ................ H02P 25/0925 |
| | | 324/130 |
| 2010/0164483 A1* | 7/2010 | Namai .................. G01R 33/07 |
| | | 324/207.2 |

(Continued)

FOREIGN PATENT DOCUMENTS

| JP | H06-074975 A | 3/1994 |
| JP | H06-251399 A | 9/1994 |

*Primary Examiner* — Alvaro E Fortich
(74) *Attorney, Agent, or Firm* — NSIP Law

(57) ABSTRACT

A circuit for monitoring an output voltage of a hall sensor includes an input port electrically connected to a first hall-sensor output terminal; an output port to output a monitoring voltage; a holder electrically connected to the input port to save the voltage of the input port; a first buffer including a first output terminal and first input terminal having an input impedance higher than an output impedance, having a voltage corresponding to a voltage of the first output terminal, and electrically connected to the holder; a second buffer including a second output terminal and second input terminal having an input impedance higher than an output impedance, having a voltage corresponding to a voltage of the second output terminal, and electrically connected to the input port; and an amplifier producing the monitoring voltage by amplifying a difference in voltages between the first output terminal and the second output terminal.

15 Claims, 4 Drawing Sheets

(56) References Cited

U.S. PATENT DOCUMENTS

2011/0074404 A1* 3/2011 Hikichi ............... G01R 33/072
                     324/251
2012/0256622 A1* 10/2012 Kim ...................... G01R 33/07
                     324/251

* cited by examiner

CIRCUIT FOR MONITORING VOLTAGE OF OUTPUT TERMINAL OF HALL SENSOR AND CIRCUIT FOR SUPPORTING LENS MODULE ACTUATING CONTROLLER

CROSS-REFERENCE TO RELATED APPLICATION(S)

This application claims the benefit under 35 USC § 119(a) of Korean Patent Application No. 10-2019-0161309 filed on Dec. 6, 2019 in the Korean Intellectual Property Office, the entire disclosure of which is incorporated herein by reference for all purposes.

BACKGROUND

1. Field

The following description relates to a circuit for monitoring a voltage of an output terminal of a hall sensor and a circuit for supporting a lens module actuating controller.

2. Description of Background

In general, a technique for fixing a position relative to the outside of a lens module is widely used when the lens module moves according to a force received from the outside.

For example, the camera module may include an optical image stabilizer device, which fixes a position of the lens module, even when the camera module is subjected to external force.

A hall sensor may be used to measure position information of the lens module, and the hall sensor may output a voltage that varies depending on the position of the lens module. Accuracy of optical image stabilization may be higher as accuracy of the correspondence between the output voltage of the hall sensor and the position information of the lens module increases.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An output voltage of a hall sensor may vary slightly, depending on a temperature of the hall sensor. As changes in an output voltage according to the temperature of the hall sensor are substantially independent of a position of the lens module, the temperature changes of the hall sensor may lower accuracy of correspondence between the position information of the lens module and the lens module.

A circuit for monitoring a voltage of an output terminal of a hall sensor, capable of monitoring relatively small variations in the output voltage of the hall sensor without substantially affecting the output voltage of the hall sensor and a circuit for supporting a lens module actuating controller capable of supporting a correction of a lens-module actuating value of a lens module actuating controller.

In one general aspect, a circuit for monitoring an output voltage of a hall sensor includes an input port configured to be electrically connected to a first hall-sensor output terminal of the hall sensor; an output port configured to output a monitoring voltage; a holder configured to be electrically connected to the input port and to save a voltage of the input port; a first buffer including a first output terminal and a first input terminal, which has an input impedance that is higher than an output impedance of the first output terminal, the first buffer having a voltage corresponding to a voltage of the first output terminal and being configured to be electrically connected to the holder; a second buffer including a second output terminal and a second input terminal, which has an input impedance that is higher than an output impedance of the second output terminal, the second buffer having a voltage corresponding to a voltage of the second output terminal, and being configured to be electrically connected to the input port; and an amplifier configured to produce the monitoring voltage by amplifying a difference in voltages between the first output terminal and the second output terminal.

In another general aspect, a circuit for supporting a lens module actuating controller includes an input port configured to receive an input voltage; a holder configured to be electrically connected to the input port and to save a voltage of the input port; a first buffer including a first output terminal and a first input terminal, which has an input impedance that is higher than an output impedance of the first output terminal, the first buffer having a voltage corresponding to a voltage of the first output terminal, and being configured to be electrically connected to the holder; a second buffer including a second output terminal and a second input terminal, which has an input impedance that is higher than an output impedance of the second output terminal, the second buffer having a voltage corresponding to a voltage of the second output terminal, and being configured to be electrically connected to the input port; an amplifier configured to produce a monitoring voltage by amplifying a difference in voltages between the first output terminal and the second output terminal; and an output port configured to provide the monitoring voltage to a lens module actuating controller. The lens module actuating controller is configured to produce a lens-module actuating value based on information provided from the outside, to correct the lens-module actuating value based on the monitoring voltage, and to produce a lens-module actuating signal corresponding to the corrected lens-module actuating value.

The first buffer may include a first operational amplifier including the first input terminal, the first output terminal and a third input terminal, and the third input terminal may be configured to be electrically connected to the first output terminal. The second buffer may include a second operational amplifier including the second input terminal, the second output terminal and a fourth input terminal, and the fourth input terminal may be configured to be electrically connected to the second output terminal.

The amplifier may include a third operational amplifier including a fifth input terminal, a sixth input terminal, and a third output terminal; a first impedance element electrically connected between the fifth input terminal and the first output terminal; a second impedance element electrically connected to the fifth input terminal; a third impedance element electrically connected between the sixth input terminal and the second output terminal; and a fourth impedance element electrically connected between the sixth input terminal and the third output terminal.

The amplifier may include a fifth impedance element electrically connected to the third impedance element or the fourth impedance element in parallel; and a gain-control switch configured to receive a control signal and switch a state of an electric connection of the fifth impedance element to the third impedance element or the fourth impedance element based on the control signal.

The holder may include a capacitor electrically connected to the first input terminal; and a holder switch configured to receive a control signal and switch a state of an electric connection between the capacitor and the input port based on the first control signal.

The monitoring voltage may become higher as a temperature of the hall sensor increases.

The hall sensor may include a second hall-sensor output terminal, and the input port may be configured to be electrically connected to only one of the first hall-sensor output terminal and the second hall-sensor output terminal at a time.

The hall sensor may include a second hall-sensor output terminal, and the output port may be configured to provide the monitoring voltage to a lens module operation controller configured to produce a lens-module actuating signal based on a difference in voltages between the first hall-sensor output terminal and the second hall-sensor output terminal.

The lens module actuating controller may be configured to process the information provided from the outside in a differential mode, and the input port may be configured to receive the input voltage corresponding to the information provided from the outside.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
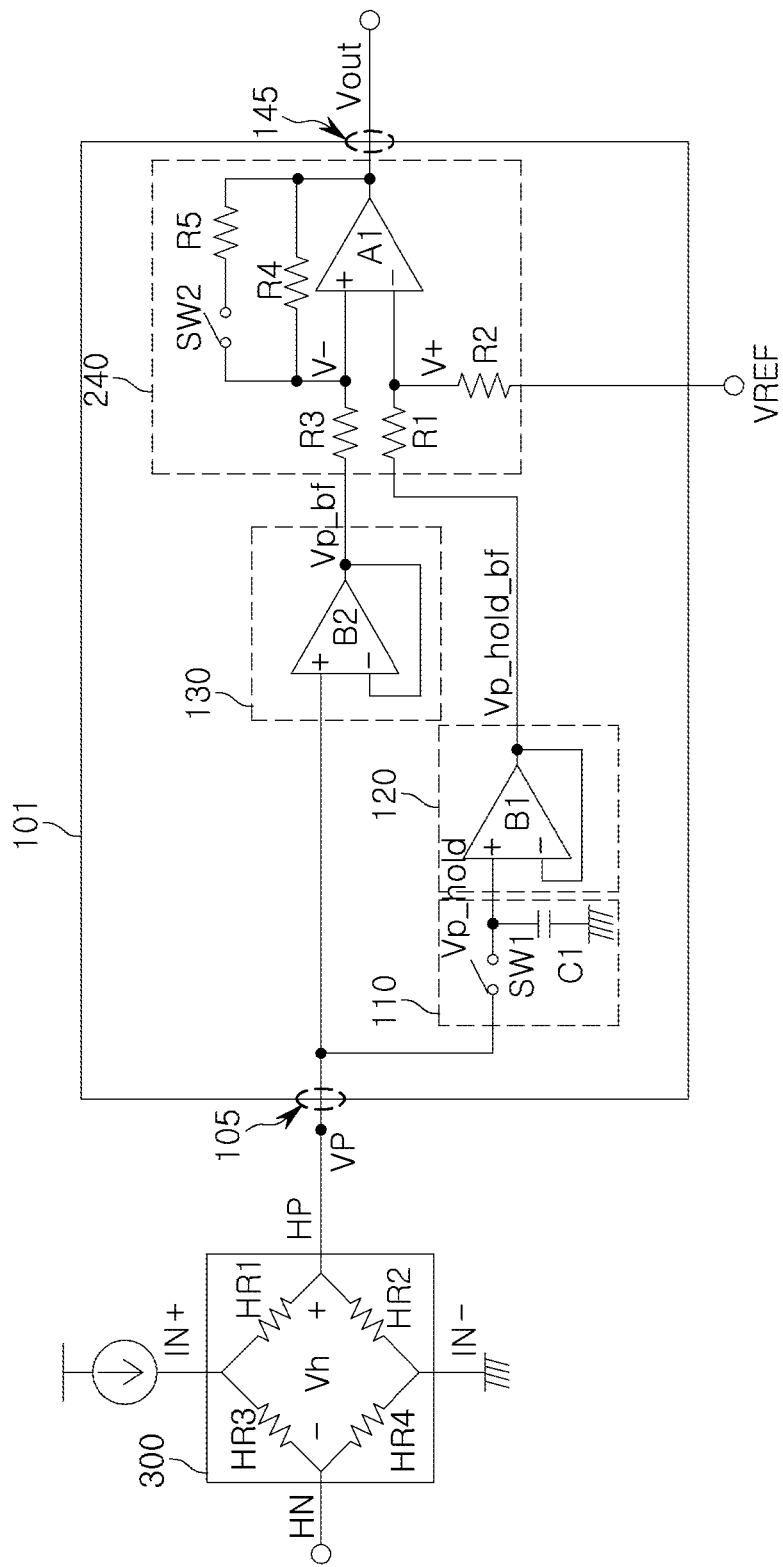
FIG. 1 is a diagram illustrating a circuit for monitoring a voltage of an output terminal of a hall sensor according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram illustrating a circuit for monitoring a voltage of an output terminal of a hall sensor according to an example.

As shown in FIG. 1, a hall sensor 300 may include first and second hall-sensor input terminals IN+ and IN−, first and second hall-sensor output terminals HP and HN, and first, second, third, and fourth hall-sensor resistors HR1, HR2, HR3, and HR4.

The hall sensor 300 may detect magnetic flux passing through the hall sensor 300 using a hall effect. The hall sensor 300 may be input with a constant current from the first and second hall-sensor input terminals IN+ and IN−, where the constant current may allow the first to fourth hall-sensor resistors HR1 to HR4 to flow. FIG. 1 illustrates the constant current and the first to fourth hall-sensor resistors HR1 to HR4 merely as an equivalent circuit and can be configured in various ways.

When magnetic flux passes through the hall sensor 300, the hall sensor 300 may produce a hall voltage in a direction perpendicular to the magnetic flux and the constant current. In this regard, a difference in voltages Vh between the first and second hall-sensor output terminals HP and HN may correspond to the hall voltage. Accordingly, the difference in voltages Vh between the first and second hall-sensor output terminals HP and HN may be used as a measurement value of the magnetic flux passing through the hall sensor 300.

However, a voltage of each of the first and second hall-sensor output terminals HP and HN may be affected by an environment (e.g., hall sensor temperature, and the like) surrounding the hall sensor 300, and the difference in voltages Vh between the first and second hall-sensor output terminals HP and HN may vary according to a change in the environment.

In view of the difference in voltages Vh between the first and second hall-sensor output terminals HP and HN being used as a measurement value of the hall sensor 300, a change in the difference in voltages Vh between the first and second hall-sensor output terminals HP and HN may be caused by not only a change in the magnetic flux of the hall sensor 300 but also a change in the environment of the hall sensor 300.

A circuit 101 for monitoring a voltage of an output terminal of a hall sensor may output a monitoring voltage Vout by monitoring one voltage of the first and second hall-sensor output terminals HP and HN of the hall sensor 300.

In view of the difference in voltages Vh between the first and second hall-sensor output terminals HP and HN being used as a measurement value of the hall sensor 300, the monitoring voltage Vout may be used to determine whether the change in the difference in voltages Vh of the first and second hall-sensor output terminals HP and HN is due to the change in the magnetic flux of the hall sensor 300 or the change in the environment of the hall sensor 300.

Accordingly, the magnetic flux passing through the hall sensor 300 may be more accurately detected.

As shown in FIG. 1, the circuit 101 for monitoring a voltage of an output terminal of a hall sensor may include a holder 110, a first buffer 120, a second buffer 130 and an amplifier 240.

An input port 105 of the circuit 101 for monitoring a voltage of an output terminal of a hall sensor may be configured to be electrically connected to the first hall-sensor output terminal HP of the hall sensor 300.

An output port 145 of the circuit 101 for monitoring a voltage of an output terminal of a hall sensor may output the monitoring voltage Vout.

For example, the circuit 101 for monitoring a voltage of an output terminal of a hall sensor may be embodied as an integrated circuit (IC), and the input port 105 and the output port 145 may be embodied as an input pin and an output pin, respectively, of the IC.

The holder can electrically connect to the input port 105 and save a voltage VP of the input port 105. The voltage Vp_hold saved in the holder 110 may be defined as a voltage of the hall-sensor output terminal HP when the hall sensor 300 is in a standard state (e.g., standard temperature). The standard state may be similar to an initial state of the hall sensor 300, but is not limited thereto.

For example, the holder 110 may include a capacitor C1 electrically connecting a first input terminal and a holder switch SW1 input with a first control signal and switching a state of an electric connection between the capacitor C1 and the input port 105 based on the first control signal.

For example, the holder switch SW1 may be configured as a transistor including a gate terminal receiving the first control signal, a drain terminal electrically connecting the input port and a source terminal electrically connecting the capacitor C1, but is not limited thereto.

The holder switch SW1 may be controlled to be in a state in which the capacitor C1 and the input port 105 are electrically connected when the hall sensor 300 is in the standard state.

The voltage Vp_hold of the capacitor C1 may be charged or discharged to be close to a voltage of the hall-sensor output terminal HP when the hall sensor 300 is in the standard state.

When the hall sensor 300 is not in the standard state, it may be controlled such that the capacitor C1 and the input port 105 are electrically cut off.

The voltage Vp_hold of the capacitor C1 may be substantially irrelevant to the voltage VP of the input port 105.

Accordingly, the voltage Vp_hold of the capacitor C1 may be maintained.

The first buffer 120 may include a first output terminal and a first input terminal, where the first input terminal has an input impedance higher than an output impedance of the first output terminal, is responsive to a voltage corresponding to a voltage Vp_hold_bf of the first output terminal and electrically connects to the holder 110.

As the input impedance of the first buffer 120 is higher than the output impedance, the voltage of the first hall-sensor output terminal HP of the hall sensor 300 may substantially not affected by the first buffer 120.

Accordingly, the circuit 101 for monitoring a voltage of an output terminal of a hall sensor according to an example may monitor the voltage of the hall sensor 300 without affecting the hall sensor 300 voltage, and may have no negative impact on another circuit employing the voltage of the hall sensor 300.

For example, the first buffer 120 may include a first operational amplifier B1 including the first input terminal, the first output terminal and a third input terminal, where the third input terminal is configured to electrically connect the first output terminal.

Accordingly, the input impedance of the first buffer 120 may be substantially infinite while the output impedance of the first buffer 120 may be substantially 0. The voltage of the hall sensor 300 may more accurately be provided.

The second buffer 130 may include a second output terminal and a second input terminal, where the second input terminal has an input impedance higher than an output impedance of the second output terminal, is responsive to a voltage corresponding to a voltage of the second output terminal and electrically connects to the input port 105.

As the input impedance of the second buffer 130 is higher than the output impedance thereof, the voltage of the first hall-sensor output terminal HP of the hall sensor 300 may substantially not be affected by the second buffer 130.

Accordingly, the circuit 101 for monitoring a voltage of an output terminal of a hall sensor according to an example may monitor the voltage of the hall sensor 300 without affecting the hall sensor 300 voltage, and may have no negative impact on another circuit employing the voltage of the hall sensor 300.

For example, the second buffer 130 may include a second operational amplifier B2 including the second input terminal, the second output terminal and a fourth input terminal, where the fourth input terminal is configured to electrically connect the second input terminal.

Accordingly, the input impedance of the second buffer 130 may be substantially infinite while the output impedance of the second buffer 130 may be substantially 0. The voltage of the hall sensor 300 may more accurately be provided.

The amplifier 240 may produce the monitoring voltage Vout by amplifying a difference between a voltage V+ corresponding to the voltage Vp_hold_bf of the first output terminal (of the first buffer 120) and a voltage V− corresponding to the voltage Vp_bf of the second output terminal (of the second buffer 130).

Accordingly, the circuit 101 for monitoring a voltage of an output terminal of a hall sensor according to an example may effectively monitor relatively small variations of the output voltage of the first hall-sensor output terminal HP of the hall sensor 300.

For example, the variations according to a temperature of the output voltage of the first hall-sensor output terminal HP of the hall sensor 300 may be comparatively smaller than that according to a position of the lens module. The circuit 101 for monitoring a voltage of an output terminal of a hall sensor may effectively monitor the variations of the output voltage according to the temperature by amplification of the amplifier 240, and can use the variations according to the temperature of the output voltage as input information such as proportional-integral-derivative (PID) control.

For example, the amplifier 240 may include a third operational amplifier A1, a first impedance element R1, a second impedance element R2, a third impedance element R3 and a fourth impedance element R4. The amplifier 240 may further include a fifth impedance element R5 and a gain-control switch SW2.

The third operational amplifier A1 may include fifth and sixth input terminals and a third output terminal.

The first impedance element R1 may be electrically connected between the fifth input terminal and the first output terminal.

The second impedance element R2 may be connected to the fifth input terminal and reference voltage provider VREF.

The third impedance element R3 may be electrically connected between the sixth input terminal and the second output terminal.

The fourth impedance element R4 may be electrically connected between the sixth input terminal and the third output terminal.

Accordingly, the amplifier 240 may have a gain based on a ratio of an impedance of the fourth impedance element R4 to an impedance of the third impedance element R3.

The hall sensor 300 may include the second hall-sensor output terminal HN, and the input port 105 may be configured to electrically connect only one of the first and second hall-sensor output terminals HP and HN.

Singular characteristics of the first and second hall-sensor output terminals HP and HN may be different from differential characteristics of the first and second hall-sensor output terminals HP and HN.

Accordingly, in view of the difference in voltages Vh between the first and second hall-sensor output terminals HP and HN being used as a measurement value of the hall sensor 300, the monitoring voltage Vout may be more effectively used to determine whether the change in the difference in voltages Vh of the first and second hall-sensor output terminals HP and HN is due to the change in the magnetic flux of the hall sensor 300 or the change in the environment of the hall sensor 300.

Further, the circuit 101 for monitoring a voltage of an output terminal of a hall sensor according to an example may be configured to have a comparatively simple structure for monitoring a temperature of the hall sensor 300 by electrically connecting only one of the first and second hall-sensor output terminals HP and HN.

Figure 2:
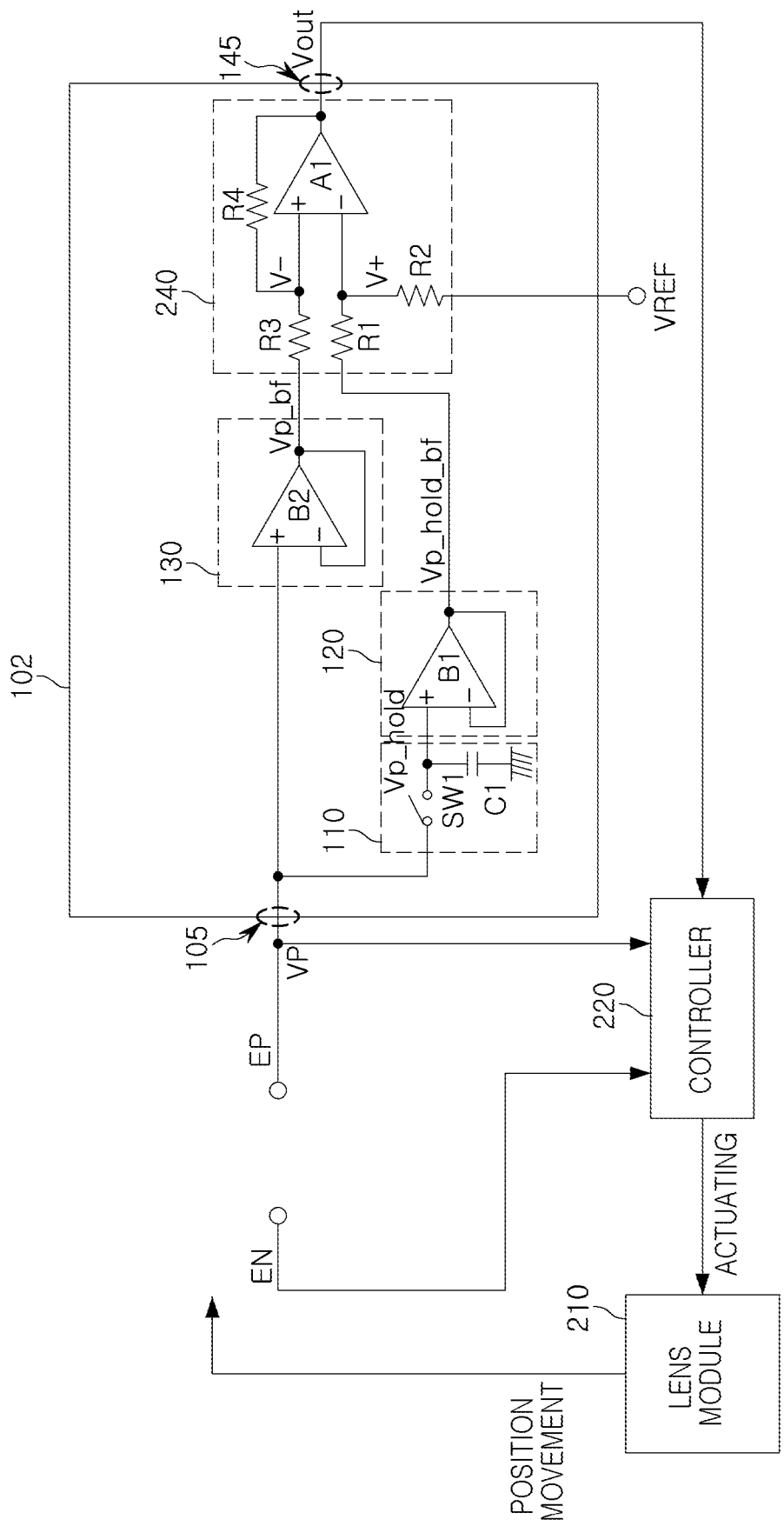
FIG. 2 is a diagram illustrating a circuit for supporting a lens module actuating controller.

FIG. 2 is a diagram illustrating a circuit for supporting a lens module actuating controller.

As shown in FIG. 2, a circuit 102 for supporting a lens module actuating controller according to an example may include a holder 110, a first buffer 120, a second buffer 130 and an amplifier 240. The holder 110, the first and second buffers 120 and 130 and the amplifier 240 may be configured similarly or equally to those of a circuit for monitoring a voltage of an output terminal of a hall sensor discussed herein.

The monitoring voltage Vout produced by the amplifier 240 may be delivered to a lens module actuating controller 220 through an output port 145 of the circuit 102 for supporting a lens module actuating controller.

The circuit 102 for supporting a lens module actuating controller may be linked to the lens module actuating controller 220 in parallel, and may support a correction of a lens-module actuating value by monitoring a change in at least part of the voltage of information (EP and EN) provided from the outside.

The lens module actuating controller 220 may create a lens-module actuating value based on the information (EP and EN) provided from the outside, correct the lens-module actuating value based on the monitoring voltage and create a lens-module actuating signal corresponding to the corrected lens-module actuating value.

A position of a lens module 210 may be controlled based on the lens-module actuating signal. For example, an actuator is supplied with a current and/or voltage corresponding to the lens-module actuating signal and outputs physical force or electromagnetic force corresponding to the current and/or voltage, thereby controlling the lens module 210.

The information (EP and EN) provided from the outside may be affected by not only a change in the position of the lens module 210 but also a factor (e.g., environmental temperature change) substantially irrelevant to the position of the lens module 210.

Accordingly, the lens-module actuating value may have characteristics of both the factors according to the change in the position of the lens module 210 and the factors substantially irrelevant to the change in the position of the lens module 210.

As the lens module actuating controller 220 can create a lens-module actuating signal by correcting the lens-module actuating value based on the monitoring voltage Vout, the lens-module actuating signal may have a lower percentage of the factors substantially irrelevant to the change in the position of the lens module 210 compared to that of the lens-module actuating value.

Accordingly, the lens module actuating controller 220 may control the actuation of the lens module 210 using a lens-module actuating signal to which the position of the lens module 210 is more accurately reflected, and the circuit 102 according to an example for supporting a lens module actuating controller can effectively support improvement of actuation accuracy of the lens module actuating controller 220.

The circuit 102 for supporting a lens module actuating controller and the lens module actuating controller 220 may be configured as a plurality of individual integrated circuits (ICs) or in combination as a single IC.

Figure 3:
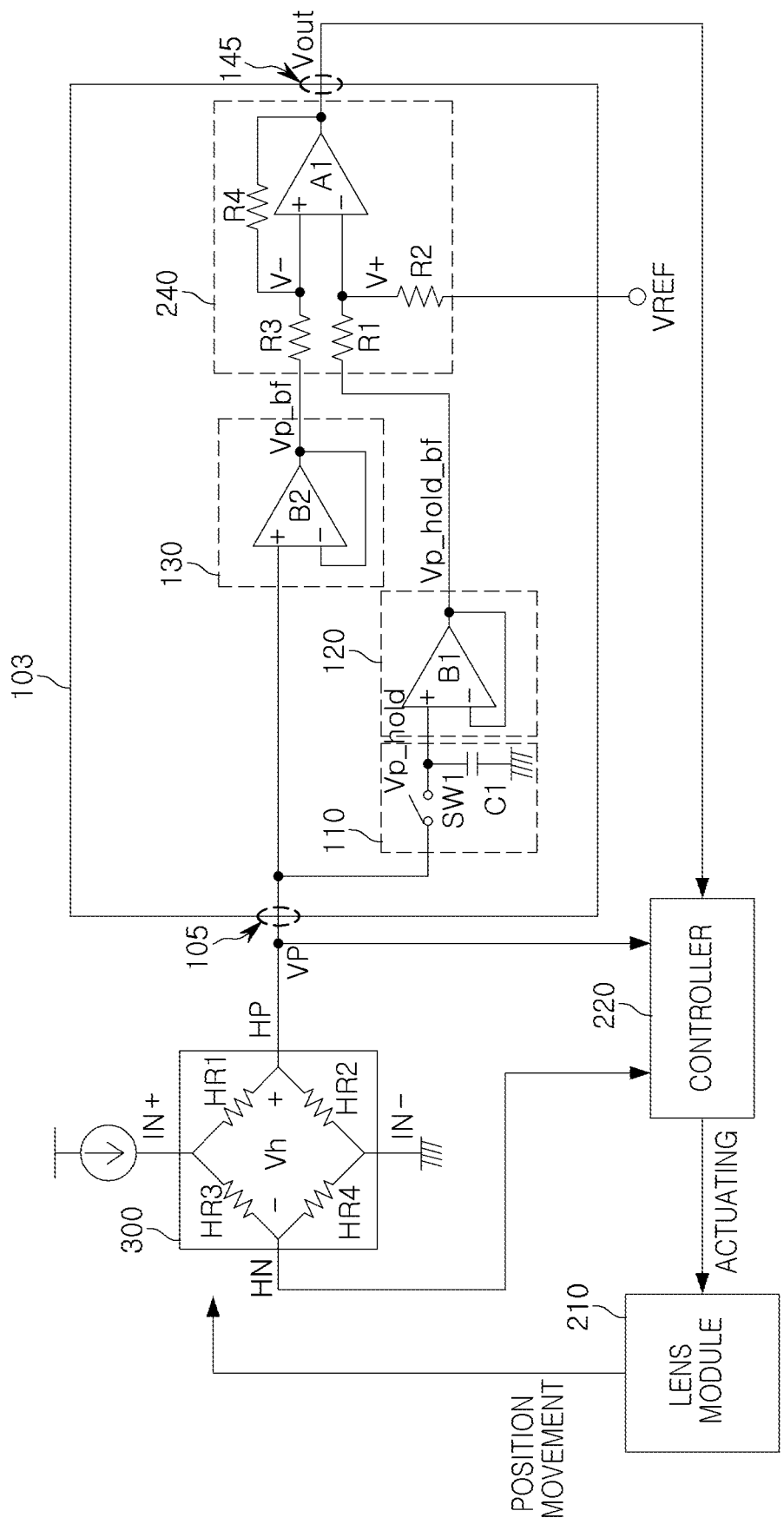
FIG. 3 is a diagram illustrating a structure of FIG. 2 combined with a structure of FIG.

FIG. 3 is a diagram illustrating a structure of FIG. 2 combined with which a structure of FIG. 1.

As shown in FIG. 3, when the lens module 210 is moving, magnetic flux passing through the hall sensor 300 may change, and the difference in voltages between the first and second hall-sensor output terminals HP and HN of the hall sensor 300 may change according to the magnetic flux change.

The lens module actuating controller 220 can create a lens-module actuating signal based on a difference in voltages Vh between the first and second hall-sensor output terminals HP and HN, and the difference in voltages Vh between the first and second hall-sensor output terminals may be determined based on the position of the lens module 210.

For example, the lens module actuating controller 220 can control the position of the lens module 210 to move in a direction opposite to the direction in which the lens module 210 moved. Accordingly, substantial movements of the lens module 210 according to an external force (e.g., force of an electric device equipped with a lens module due to shaking of a hand) can be minimized, and a stable image can be provided.

A circuit 103 for monitoring a hall-sensor output terminal voltage and/or supporting a lens module actuating controller can be input with one voltage VP of the first and second hall-sensor output terminals HP and HN and create a monitoring voltage Vout as well as providing the monitoring voltage Vout to the lens module actuating controller 220

The difference in voltages between the first and second hall-sensor output terminals HP and HN may vary slightly due to a change in the hall sensor 300 temperature. The circuit 103 for monitoring a hall-sensor output terminal voltage and/or supporting a lens module actuating controller can provide the monitoring voltage Vout to the lens module actuating controller 220 such that the variation in the voltage difference between the first and second hall-sensor output terminals HP and HN according to the change in temperature is canceled.

In this regard, the lens module actuating controller 220 can be prevented from malfunctioning by acknowledging that the lens module 210 moves according to the change in temperature of the hall sensor 300. Further, optical image stabilization of an image of the lens module due to the malfunction of the lens module actuating controller 220 can be achieved.

Hereinafter, examples of the correction of specific temperatures of the circuit 103 for monitoring a hall-sensor output terminal voltage and/or supporting a lens module actuating controller will be described.

TABLE 1

| Items | Indication | Measurement conditions | min | unit |
|---|---|---|---|---|
| Hall output voltage | Vh | B = 150 mT, IE = 1 mA, Ta = 25° C. | 200 | mV |
| Input resistance | Rin | B = 0 mT, IE = 0.1 mA, Ta = 25° C. | 2000 | Ohm |
| Output resistance | Rout | B = 0 mT, IE = 0.1 mA, Ta = 25° C. | 4000 | ohm |
| Hall output voltage temperature coefficient | aVh | B = 150 mT, IE = 1 mA, Ta = 25° C.-100° C. | −0.09 | %/C. |

The hall sensor 300 may have the electric characteristics shown in Table 1. It can be assumed that an offset voltage value of a hall output is 0 and voltage changes of the first and second hall-sensor output terminals HP and HN due to strength of magnetic field are the same.

When magnetic field around the hall sensor 300 is B=0 mT, first to fourth resistance values R1 to R4 of the first to fourth hall-sensor resistor HR1 to HR4, respectively, may have a common resistance value R. The first to fourth resistance values R1 to R4 may be 2 Kohm, but are not limited thereto.

$$Rin = (R1+R2)//(R3+R4) = 2R// \quad 2R = R = 2\ \text{Kohm} \qquad \text{Equation 1:}$$

When 1 mA of a constant current is applied to the hall sensor 300 in B=0 mT, 0.5 mA of the same amount of current may flow in the first to fourth hall-sensor resistor HR1 to HR4. Vh_0 mT, a difference between Vp_0 mT and Vn_0 mT, the voltage of the first and second hall-sensor output terminals HP and HN, respectively, and the voltage of the first and second hall-sensor output terminals HP and HN may be as follows:

$$Vp\_0\ \text{mT} = 0.5\ \text{mA} * 2\text{Kohm} = 1.0\ \text{V} \qquad \text{Equation 2:}$$

$$Vn\_0\ \text{mT} = 0.5\ \text{mA} * 2\ \text{Kohm} = 1.0\ \text{V} \qquad \text{Equation 3:}$$

$$Vh\_0\ \text{mT} = Vp\_0\ \text{mT} - Vn\_0\ \text{mT} = 0\ \text{V} \qquad \text{Equation 4:}$$

Taking, for example, that voltage differences between the first and second hall-sensor output terminals HP and HN according to changes in the magnetic field are the same, Vp_150 mT and Vn_150 mT, the voltage of the first and second hall-sensor output terminals HP and HN, respectively, in B=150 mT, may be as follows:

$$Vp\_150\ \text{mT} = Vp\_0\ \text{mT} + (Vh\_150\ \text{mT}/2)$$

$$Vn\_150\ \text{mT} = Vn\_0\ \text{mT} - (Vh\_150\ \text{mT})/2 \qquad \text{Equation 6:}$$

As Vh_150 mT is 200 mV in Table 1, Vp_150 mT=1100 mV and Vn_150 mT=900 mV based on Equations 5 and 6.

An output voltage temperature coefficient aVh in Table 1 can be defined by the following equation:

$$aVh = ((Vh\_T2 - Vh\_T1)/(T2-T1))/Vh\_T1) * 100 \qquad \text{Equation 7:}$$

In Equation 7, Vh_T1 and Vh_T2 refer to voltage differences between the first and second hall-sensor output terminals HP and HN at temperatures T1 and T2.

A Vh_temp according to the temperature in B=150 mT may be calculated as in Equation 7, while Vp_temp and Vn_temp voltages may be calculated as in Equations 5 and 6, respectively.

$$Vh\_\text{temp} = Vh\_150\ \text{mT} + (aVh/100) * (\text{temp} - 25) \qquad \text{Equation 8:}$$

$$Vp\_\text{temp} = Vp\_0\ \text{mT} + Vh\_\text{temp}/2 \qquad \text{Equation 9:}$$

$$Vn\_\text{temp} = Vn\_0\ \text{mT} - Vh\_\text{temp}/2 \qquad \text{Equation 10:}$$

Equations 8, 9, and 10 are used to calculate Vh_25 C, Vh_100 C, Vp_25 C, Vp_100 C, Vn_25 C and Vn_125 C, and the results are as follows:

$$Vh\_25\ C = 200\ mV$$

$$Vh\_100\ C = 186.5\ mV$$

$$Vp\_25\ C = 1100\ mV$$

$$Vp\_100\ C = 1093.25\ mV$$

$$Vn\_25\ C = 900\ mV$$

$$Vn\_100\ C = 906.75\ mV$$

Temperature coefficients aVp and aVn of the first and second hall-sensor output terminals HP and HN are calculated using Equation 7 and the above values as follows:

$$aVp = ((Vp\_100\ C - Vp\_25\ C)/(100-25))/Vp\_25\ C)*100 = -0.0082\%/C$$

$$aVn = ((Vn\_100\ C - Vn\_25\ C)/(100-25))/Vn\_25\ C)*100 = 0.01\%/C$$

Accordingly, the temperature change of the hall sensor 300 can be measured using the voltage of the first or second hall-sensor output terminal HP or HN, instead of the voltage difference therebetween.

Taking, for example, that an initial temperature of the hall sensor 300 is 25° C. and the temperature increases up to 40° C. during operation, the voltage of the first or second hall-sensor output terminal HP or HN can be calculated using Equations 9 and 10 at 40° C. The voltage of the first or second hall-sensor output terminal HP or HN may be as follows:

$$dVp = Vp\_40 - Vp\_25 = 1098.65\ mV - 1100\ mV = -1.35\ mV \qquad \text{Equation 11:}$$

$$dVn = Vn\_40 - Vn\_25 = 901.35\ mV - 900\ mV = 1.35\ mV \qquad \text{Equation 12}$$

Taking, for example, that the lens module actuating controller 220 uses a digital value of 12 bit for a 2 V input signal range, 1 Least Significant Bit (LSB) is LSB=2V/(2^12)=0.488 mV, and dVp and dVn, the voltage changes of the first or second hall-sensor output terminal (HP or HN) according to the temperature change may merely be 3 LSB.

For example, when a range of a change according to noise of an input signal of the lens module actuating controller 220 is 2 LSB, the lens module actuating controller 220 may have difficulty in effective use of the change of 3 LB according to the temperature change of the hall sensor 300.

Accordingly, the circuit 103 for monitoring a hall-sensor output terminal voltage and/or supporting a lens module actuating controller may amplify dVp or dVn, a voltage change according to the temperature change.

In a first time range (t<t1), a holder switch may be an on-state, and a voltage of the capacitor C1 may become equal to a voltage VP of an input port.

In a second time range (t=t1 or t>t1), the holder switch SW may be an off-state.

According to design, a first time range is t=t1, and a second time range is t<t1 and t>t1.

In the case of the second time range, a voltage of the capacitor C1 may not change despite a change in the voltage VP of the input port 105, and may be Vp_hold_bf. An output voltage Vp_hold of the first buffer 120 may be substantially the same as Vp_hold_bf.

$$Vp\_hold\_bf = Vp\_hold \qquad \text{Equation 13:}$$

Vp_bf, the output voltage of the second buffer 130 may be substantially the same as the voltage VP of the first or second hall-sensor output terminals HP or HN.

$$Vp\_bf = VP \qquad \text{Equation 14:}$$

V− and V+ of first and second input terminals of the amplifier 240 are as follows:

$$V- = R1/(R1+R2)*(Vout-Vp\_bf) + Vp\_bf \qquad \text{Equation 15:}$$

$$V+ = R1/(R1+R2)*(VREF-Vp\_hold\_bf) + Vp\_hold\_bf \qquad \text{Equation 16:}$$

As V− and V+ may be the same, Equations 15 and 16 may be expressed as follows:

$$R1/(R1+R2)*(Vout-Vp\_bf) + Vp\_bf = R1/(R1+R2)*(VREF-Vp\_hold\_bf) + Vp\_hold\_bf \qquad \text{Equation 17:}$$

Equation 17 is approximated in terms of Vout using Equations 13 and 14 as follows:

$$Vout = VREF + (R2/R1)*(Vp\_hold-Vp). \qquad \text{Equation 18:}$$

That is, the circuit 103 for monitoring a hall-sensor output terminal voltage and/or supporting a lens module actuating controller may amplify a difference between an actuating voltage of a P terminal and a current actuating voltage by an amplified gain of the amplifier 240 and output the same based on a reference voltage VREF.

Although the voltage difference of the first or second hall-sensor output terminal HP or HN for the actuating temperature (25° C. to 40° C.) in Equation 11 is −1.35 mA, the monitoring voltage Vout may be amplified to 13.5 mV by ten times, when resistance of a fourth impedance element R4 is 10 times higher than that of a third impedance element R3.

In this regard, the lens module actuating controller 220 may divide a change range of the input signal according to the temperature change of the hall sensor 300 in dozens of bits (e.g., approximately 28 bits based on Equations 11 and 12). As such, the temperature change of the hall sensor 300 may be more accurately detected without being affected by the noise (e.g., 2 bits of change range) according to the noise of the input signal.

Figure 4:
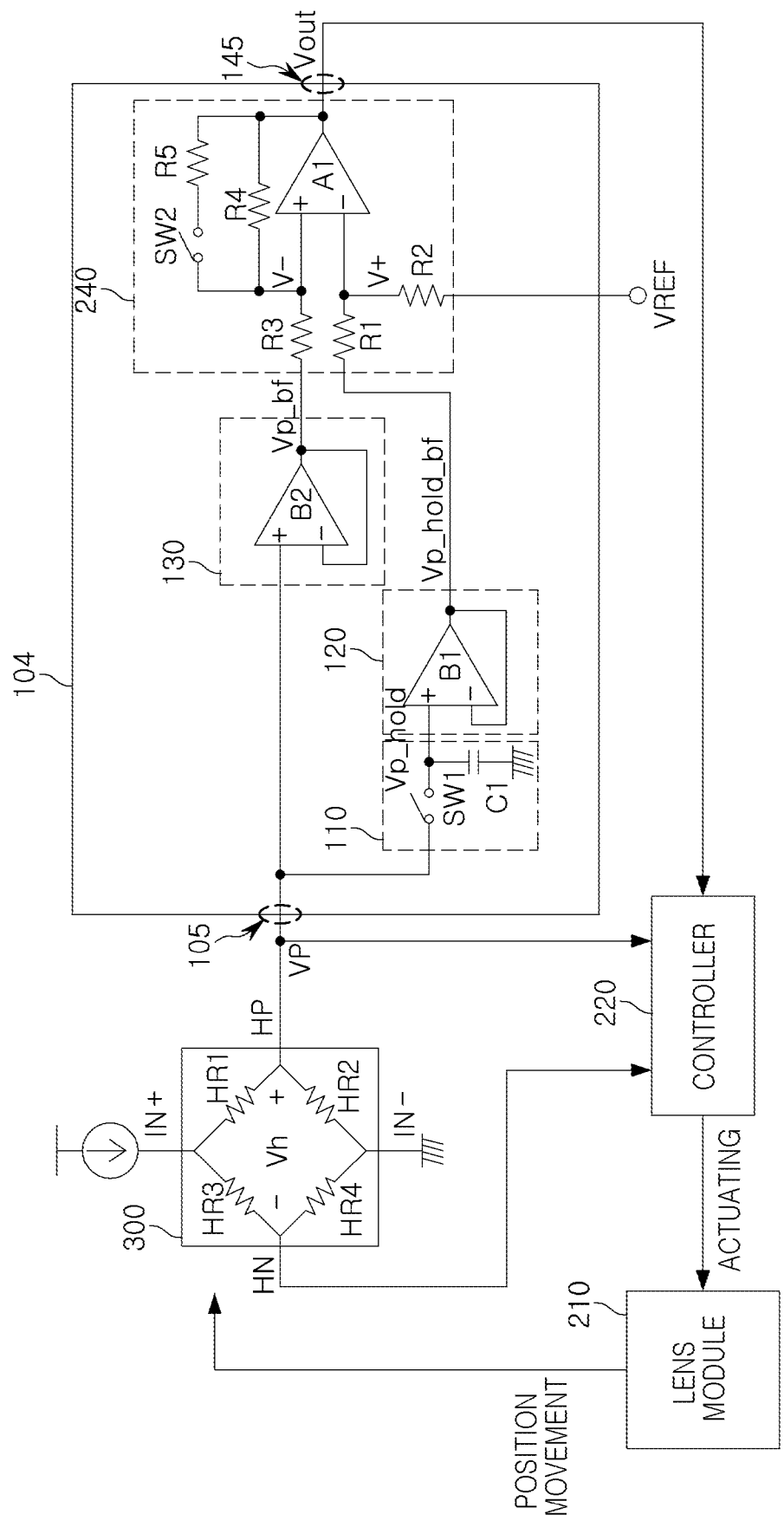
FIG. 4 is a diagram illustrating an amplified variable gain structure of a circuit for monitoring a voltage of an output terminal of a hall sensor according to an example.

FIG. 4 is a diagram illustrating an amplified variable gain structure of a circuit for monitoring a voltage of an output terminal of a hall sensor according to an example.

As shown in FIG. 4, an amplifier 240 of a circuit according to an example for monitoring a hall-sensor output terminal voltage and/or supporting a lens module actuating controller may further include a fifth impedance element R5 and a gain-control switch SW2.

The fifth impedance element R5 may be connected to the third or fourth impedance element R3 or R4 in parallel.

The gain-control switch SW2 is configured to receive a second control signal and switch a state of an electric connection of the fifth impedance element R5 to the third or fourth impedance element R3 or R4 based on the second control signal.

According to switching of the gain-control switch SW2, a total impedance of the third or fourth impedance element R3 or R4 and the fifth impedance element R5 may be changed, and a gain of the amplifier 240 may change.

As an effect according to the temperature change range of the hall sensor 300 or the noise of the input signal of the lens module actuating controller 220 may vary depending on use of a camera to which the lens module 210 is applied, the circuit according to an example for monitoring a hall-sensor output terminal voltage and/or supporting a lens module actuating controller, by having an amplification gain change structure, may be more flexible to the use of the camera to easily optimize a temperature monitoring range of the hall sensor 300. Further, an error of the temperature monitoring of the hall sensor 300 may be reduced.

A circuit according to various examples for monitoring a voltage of an output terminal of a hall sensor may detect relatively small variations in the output voltage of the hall sensor without substantially affecting the output voltage of the hall sensor.

A circuit according to various examples for supporting a lens module actuating controller may support a correction of a lens-module actuating value of a lens module.

A circuit according to various examples for monitoring a hall-sensor output terminal voltage and/or supporting a lens module actuating controller may effectively monitor variations of an output voltage according to a temperature of a hall sensor, and may monitor the temperature of the hall sensor even in a distance from the hall sensor.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A circuit for monitoring an output voltage of a hall sensor, the circuit comprising:
    an input port configured to be electrically connected to a first hall-sensor output terminal of the hall sensor;
    an output port configured to output a monitoring voltage;
    a holder configured to be electrically connected to the input port and to save a voltage of the input port;
    a first buffer comprising a first output terminal and a first input terminal, which has an input impedance that is higher than an output impedance of the first output terminal, the first buffer having a voltage corresponding to a voltage of the first output terminal and being configured to be electrically connected to the holder;
    a second buffer comprising a second output terminal and a second input terminal, which has an input impedance that is higher than an output impedance of the second output terminal, the second buffer having a voltage corresponding to a voltage of the second output terminal, and being configured to be electrically connected to the input port; and
    an amplifier configured to produce the monitoring voltage by amplifying a difference in voltages between the first output terminal and the second output terminal.

2. The circuit of claim 1, wherein the first buffer comprises a first operational amplifier comprising the first input terminal, the first output terminal and a third input terminal, and the third input terminal is configured to be electrically connected to the first output terminal, and
    the second buffer comprises a second operational amplifier comprising the second input terminal, the second output terminal and a fourth input terminal, and the fourth input terminal is configured to be electrically connected to the second output terminal.

3. The circuit of claim 2, wherein the amplifier comprises:
    a third operational amplifier comprising a fifth input terminal, a sixth input terminal, and a third output terminal;
    a first impedance element electrically connected between the fifth input terminal and the first output terminal;
    a second impedance element electrically connected to the fifth input terminal;
    a third impedance element electrically connected between the sixth input terminal and the second output terminal; and
    a fourth impedance element electrically connected between the sixth input terminal and the third output terminal.

4. The circuit of claim 3, wherein the amplifier comprises:
    a fifth impedance element electrically connected to the third impedance element or the fourth impedance element in parallel; and
    a gain-control switch configured to receive a control signal and switch a state of an electric connection of the fifth impedance element to the third impedance element or the fourth impedance element based on the control signal.

5. The circuit of claim 1, wherein the holder comprises:
    a capacitor electrically connected to the first input terminal; and
    a holder switch configured to receive a control signal and switch a state of an electric connection between the capacitor and the input port based on the first control signal.

6. The circuit of claim 1, wherein the monitoring voltage becomes higher as a temperature of the hall sensor increases.

7. The circuit of claim 1, wherein the hall sensor comprises a second hall-sensor output terminal, and
    the input port is configured to be electrically connected to only one of the first hall-sensor output terminal and the second hall-sensor output terminal at a time.

8. The circuit of claim 1, wherein the hall sensor comprises a second hall-sensor output terminal, and
    the output port is configured to provide the monitoring voltage to a lens module operation controller configured to produce a lens-module actuating signal based on a difference in voltages between the first hall-sensor output terminal and the second hall-sensor output terminal.

9. The circuit of claim 8, wherein the lens module operation controller is configured to produce a lens-module actuating value based on information provided from the outside of the lens module operation controller, correct the lens-module actuating value based on the monitoring voltage, and produce the lens-module actuating signal corresponding to the corrected lens-module actuating value.

10. A circuit for supporting a lens module actuating controller, comprising:
    an input port configured to receive an input voltage;
    a holder configured to be electrically connected to the input port and to save a voltage of the input port;
    a first buffer comprising a first output terminal and a first input terminal, which has an input impedance that is higher than an output impedance of the first output terminal, the first buffer having a voltage corresponding to a voltage of the first output terminal, and being configured to be electrically connected to the holder;

a second buffer comprising a second output terminal and a second input terminal, which has an input impedance that is higher than an output impedance of the second output terminal, the second buffer having a voltage corresponding to a voltage of the second output terminal, and being configured to be electrically connected to the input port;

an amplifier configured to produce a monitoring voltage by amplifying a difference in voltages between the first output terminal and the second output terminal; and an output port configured to provide the monitoring voltage to a lens module actuating controller, wherein the lens module actuating controller is configured to produce a lens-module actuating value based on information provided from the outside, to correct the lens-module actuating value based on the monitoring voltage, and to produce a lens-module actuating signal corresponding to the corrected lens-module actuating value.

11. The circuit of claim 10, wherein the first buffer comprises a first operational amplifier comprising the first input terminal, the first output terminal and a third input terminal, and the third input terminal is configured to be electrically connected to the first output terminal, and the second buffer comprises a second operational amplifier comprising the second input terminal, the second output terminal and a fourth input terminal, and the fourth input terminal is configured to be electrically connected to the second output terminal.

12. The circuit of claim 11, wherein the amplifier comprises:

a third operational amplifier comprising a fifth input terminal and a sixth input terminal, and a third output terminal;

a first impedance element electrically connected between the fifth input terminal and the first output terminal;

a second impedance element electrically connected to the fifth input terminal;

a third impedance element electrically connected between the sixth input terminal and the second output terminal; and a fourth impedance element electrically connected between the sixth input terminal and the third output terminal.

13. The circuit of claim 12, wherein the amplifier comprises:

a fifth impedance element electrically connected to the third impedance element or the fourth impedance element in parallel; and a gain-control switch configured to receive a control signal and switch a state of an electric connection of the fifth impedance element to the third impedance element or the fourth impedance element based on the control signal.

14. The circuit of claim 10, the holder comprises:

a capacitor electrically connected to the first input terminal; and a holder switch configured to receive a first control signal and switch a state of an electric connection between the capacitor and the input port based on the first control signal.

15. The circuit of claim 10, wherein the lens module actuating controller is configured to process the information provided from the outside in a differential mode, and the input port is configured to receive the input voltage corresponding to the information provided from the outside.

* * * * *